United States Patent
Song et al.

(10) Patent No.: US 8,610,154 B2
(45) Date of Patent: Dec. 17, 2013

(54) SIDE-VIEW TYPE LIGHT EMITTING DEVICE AND LINE LIGHT SOURCE TYPE LIGHT EMITTING DEVICE

(75) Inventors: Ho Young Song, Gyunggi-do (KR); Sung Min Yang, Gyunggi-do (KR); Yong Chun Kim, Gyunggi-do (KR); Won Soo Ji, Gyunggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 564 days.

(21) Appl. No.: 12/479,436

(22) Filed: Jun. 5, 2009

(65) Prior Publication Data

US 2010/0123159 A1    May 20, 2010

(30) Foreign Application Priority Data

Nov. 18, 2008  (KR) .................. 10-2008-0114888

(51) Int. Cl.
*H01L 33/00* (2010.01)
(52) U.S. Cl.
USPC ........ 257/99; 313/500; 313/502; 362/217.05; 362/249.02; 362/97.3; 362/609; 362/247; 257/98; 257/E33.072
(58) Field of Classification Search
USPC .......................................................... 257/99
See application file for complete search history.

(56) References Cited

U.S. PATENT DOCUMENTS

| | | | |
|---|---|---|---|
| 7,422,338 B2 * | 9/2008 | Kono et al. | 362/27 |
| 2006/0163602 A1 * | 7/2006 | Isokawa | 257/100 |
| 2007/0247841 A1 | 10/2007 | Kono et al. | |
| 2008/0173883 A1 * | 7/2008 | Hussell et al. | 257/98 |
| 2009/0200566 A1 * | 8/2009 | Bukesov | 257/98 |

FOREIGN PATENT DOCUMENTS

| | | |
|---|---|---|
| JP | 08-095503 | 4/1996 |
| JP | 2004-022177 | 1/2004 |
| JP | 2006-228589 | 8/2006 |
| JP | 2007-311736 A | 11/2007 |
| JP | 2008-041567 | 2/2008 |
| WO | WO 2004-112155 A1 | 12/2004 |

OTHER PUBLICATIONS

English translation of Japanese Office Action issued in Japanese Patent Application No. 2009-142062 dated Oct. 7, 2011.
Japanese Office Action, and English translation thereof, issued in Japanese Patent Application No. 2009-142062 dated Jun. 5, 2012.

* cited by examiner

*Primary Examiner* — Jerome Jackson, Jr.
(74) *Attorney, Agent, or Firm* — McDermott Will & Emery LLP

(57) ABSTRACT

A side-view type light emitting device includes a package body, a lead frame, and a light emitting diode (LED). The package body has a first surface provided as a mount surface, a second surface disposed on a side opposite to the first surface, and lateral surfaces disposed between the first surface and the second surface. The package body includes a recessed portion disposed on a lateral surface corresponding to a light emitting surface of the lateral surfaces. The lead frame is disposed in the package body. The LED chip is mounted on a bottom surface of the recessed portion. Protrusion parts protruding toward the LED chip are disposed in regions adjacent to the LED chip of facing inner sidewalls of the recessed portion, respectively.

17 Claims, 6 Drawing Sheets

SIDE-VIEW TYPE LIGHT EMITTING DEVICE AND LINE LIGHT SOURCE TYPE LIGHT EMITTING DEVICE

CROSS-REFERENCE TO RELATED APPLICATIONS

This application claims the priority of Korean Patent Application No. 2008-0114888 filed on Nov. 18, 2008, in the Korean Intellectual Property Office, the disclosure of which is incorporated herein by reference.

BACKGROUND OF THE INVENTION

1. Field of the Invention

The present invention relates to a light emitting device using a light emitting diode (LED), and more particularly, to a side-view type light emitting device that can uniformly emit light according to its positions and a line light source type light emitting device having a novel structure and using the LED with a point light source characteristic.

2. Description of the Related Art

In general, a light emitting diode (LED) is provided in a form of a light emitting device including a package body provided with a lead frame to which an electrode is connected. The LED may be coupled to various light receiving devices such as a backlight unit (BLU) of a liquid crystal display (LCD), a light guide plate of a surface light emitting display, and an optical sensor, and thus the LED is being used in various application fields.

Specifically, a side-view type light emitting device that is one type of the light emitting device is being widely used as a light source for the BLU of the LCD.

With the increasing tendency toward a large-scale BLU, light uniformity of the large-scale BLU must be maintained over the entire panel in spite of their large area. However, since an LED light source used as a BLU light source is a point light source, the LED light source has a disadvantage in terms of the light uniformity when compared to a related art cold cathode fluorescent lamp (CCFL) that is a line light source.

The LED is being used in the various application fields because the LED may be coupled to the light receiving devices (the BLU of the LCD, the light guide plate of the surface light emitting display, the optical sensor, etc). In such an application field, the LED has a great disadvantage in that it is difficult to realize the line light source because the LED acts as the point light source.

FIG. 1 is a graph illustrating measurement results of an output distribution of light emitted from a light emitting surface LP of a related art side-view type light emitting device 1.

Referring to FIG. 1, a light output intensity is highest at a central portion (an upper side of an LED chip 5) of the light emitting device 1. The light output intensity gradually decreases toward sidewall directions of the LED chip 5, and then the light output intensity increases again a little at portions adjacent to the sidewalls.

Since the LED chip 5 is disposed at a central portion of a package to condense light emitted from the LED chip 5 into a direct upper side of the LED chip 5, the light output intensity is highest at the central portion of the light emitting device 1. Also, since light distributed over side surfaces of the LED chip 5 or light diffused into the LED chip 5 is reflected from the sidewalls of a package body to emit the reflected light into the outside, the light output intensity increases in the sidewall regions. Accordingly, the light output intensity greatly depends upon reflectance and inclination of the package body.

As describe above, the side-view type light emitting device has a point light source characteristic in which an LED chip region is bright. Thus, in case where the side-view type light emitting device is applied to a light guiding panel of a BLU, the side-view type light emitting device has a hot spot region in which light brightly shines at a central portion of an LED and a dark spot region that is a dark region between the LED chips. Thus, due to such a point light source characteristic, the overall light emitting uniformity significantly decreases.

SUMMARY OF THE INVENTION

An aspect of the present invention provides a side-view type light emitting device having a novel structure that can realize a uniform light distribution over an irradiation target object such as a light guiding panel.

Another aspect of the present invention provides a line light source type light emitting device having a novel structure that can provide a light emitting characteristic similar to that of a line light source using an light emitting diode (LED) chip having a point light source characteristic.

According to an aspect of the present invention, there is provided a side-view type light emitting device including: a package body having a first surface provided as a mount surface, a second surface disposed on a side opposite to the first surface, and lateral surfaces disposed between the first surface and the second surface, the package body including a recessed portion disposed on a lateral surface corresponding to a light emitting surface of the lateral surfaces; a lead frame disposed in the package body; and a light emitting diode (LED) chip mounted on a bottom surface of the recessed portion, wherein protrusion parts protruding toward the LED chip are disposed in regions adjacent to the LED chip of facing inner sidewalls of the recessed portion, respectively.

The inner sidewalls in which the protrusion parts are disposed may be disposed along a long-axis direction of the recessed portion, respectively.

Each of the protrusion parts may have two reflective surfaces, and the two reflective surfaces may be inclined toward both sidewalls disposed along a short-axis direction of the recessed portion, respectively.

In this case, each of the protrusion parts may have a triangular pyramid shape in which a lateral surface is integrated with each of the inner sidewalls.

Each of the protrusion parts may extend up to the both sidewalls disposed along the short-axis direction of the recessed portion.

In this case, a width of the short-axis direction of the recessed portion in which the protrusion parts are disposed gradually may increase in a direction away from a central region adjacent to the LED chip.

The protrusion parts may be provided in plurality, and each of the protrusion parts disposed on the inner sidewalls may be disposed in a depth direction of the recessed portion.

The side-view type light emitting device may further include a resin package part disposed inside the recessed portion to surround the LED chip. In this case, the resin package part contains phosphor powder for converting a wavelength of light generated from the LED chip.

According to another aspect of the present invention, there is provided a side-view type light emitting device including: a package body having a first surface provided as a mount surface, a second surface disposed on a side opposite to the first surface, and lateral surfaces disposed between the first surface and the second surface, the package body including a recessed portion disposed on a lateral surface corresponding to a light emitting surface of the lateral surfaces; a lead frame disposed in the package body; and an LED chip mounted on a bottom surface of the recessed portion, wherein a width of a short-axis direction adjacent to the LED chip in the recessed portion is less than that of the short-axis direction at another position.

Inner sidewalls of the recessed portion may have regions in which the width of the short-axis direction adjacent to the LED chip gradually increases toward both ends of a long-axis direction, respectively. In a specific embodiment, inner sidewalls of the recessed portion may be disposed such that the width of the short-axis direction adjacent to the LED chip gradually increases up to both ends of a long-axis direction.

According to another aspect of the present invention, there is provided a line light source type light emitting device including: a package body including a recessed portion; a lead frame disposed in the package body; and a plurality of LED chips mounted on a bottom surface of the recessed portion along a long-axis direction of the recessed portion, wherein protrusion parts protruding toward each of the LED chips are disposed in regions adjacent to each of the LED chips of facing inner sidewalls of the recessed portion, respectively.

The package body may have a first surface provided as a mount surface, a second surface disposed on a side opposite to the first surface, and lateral surfaces disposed between the first surface and the second surface, and the recessed portion may be disposed on a lateral surface corresponding to a light emitting surface of the lateral surfaces.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
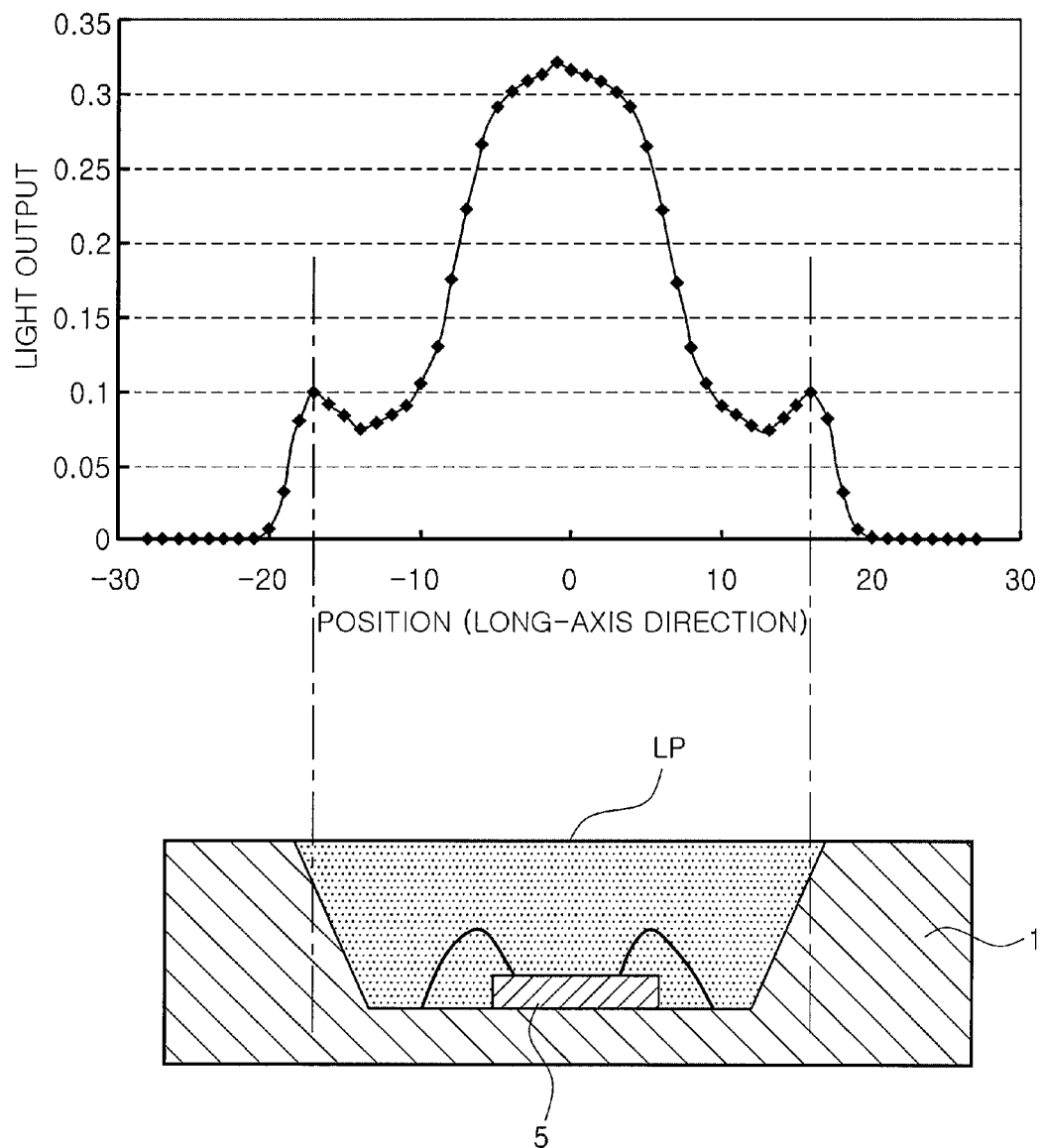
FIG. 1 is a graph illustrating measurement results of an output distribution (positions according to a long-axis direction) of light emitted from a light emitting surface of a related art side-view type light emitting device.
Figure 2A:
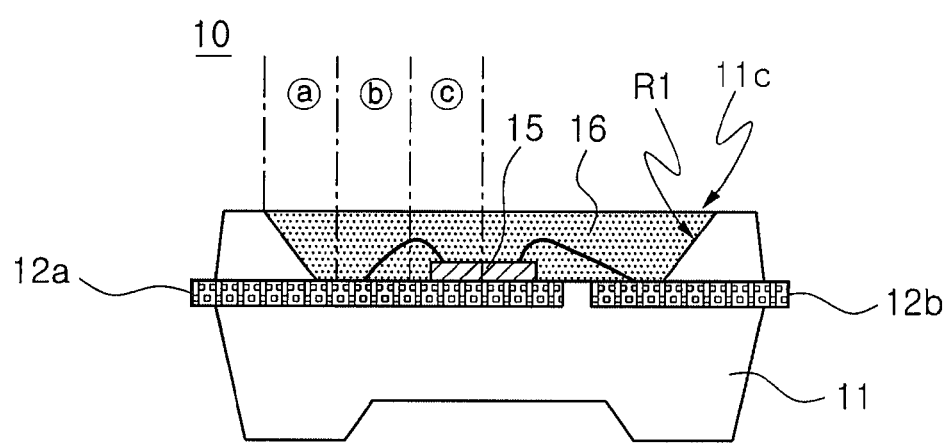
FIGS. 2a and 2b are a side cross-sectional view and an approximately perspective view of a side-view type light emitting device according to an embodiment of the present invention, respectively.
Figure 2B:
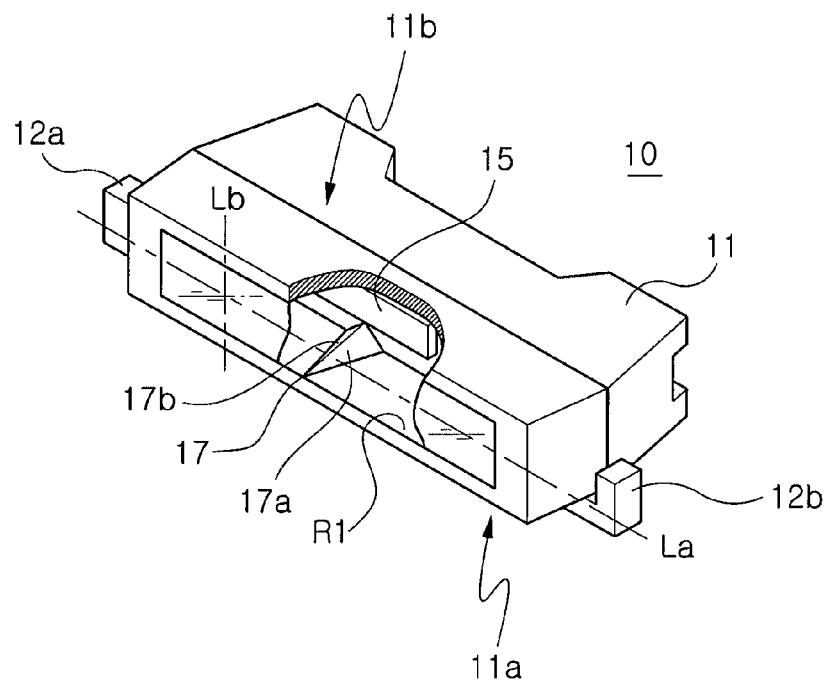

FIGS. 2a and 2b are a side cross-sectional view and an approximately perspective view of a side-view type light emitting device according to an embodiment of the present invention, respectively.

Referring to FIGS. 2a and 2b, a side-view type light emitting device 10 according to an embodiment includes a package body 11 provided with a recessed portion R1 and a light emitting diode (LED) chip 15 mounted on a bottom surface of the recessed portion R1.

The package body 11 has a first surface 11a provided as a mount surface, a second surface 11b disposed on a side opposite to the first surface 17a, and lateral surfaces disposed between the first surface 11a and the second surface 11b. The recessed portion R1 is disposed on a lateral surface corresponding to a light emitting surface 11c of the lateral surfaces.

The light emitting device 10 includes first and second lead frames 12a and 12b disposed on the package body 11 to expose the bottom surface of the recessed portion R1. In this specification, terms "a long-axis $L_a$ of the recessed portion" and "a short-axis $L_b$ of the recessed portion" denote a long width direction and a short width direction of the recessed portion R1, respectively. The long-axis $L_a$ is perpendicular to the short-axis $L_b$.

The LED chip 15 is mounted on the bottom surface of the recessed portion R1 and electrically connected to the first and second lead frames 12a and 12b, respectively. Referring to FIG. 2a, the LED chip 15 may be mounted on the first lead frame 12a, and an electrode of the LED chip 15 may be connected to the second lead frames 12b using a wire. However, the present invention is not limited thereto, and thus the electrode of the LED chip 15 may be connected using various connection methods, which are currently well known in the art. For example, in case where the LED chip has a vertical structure, the bottom surface of the LED chip may be electrically connected to the mounted lead frame without requiring wire bonding.

In this embodiment, the light emitting device 10 may include a resin package part 16 disposed inside the recessed portion R1 to surround the LED chip 15. The resin package part 16 may be formed of a well-known transparent resin. For example, the resin package part 16 may be formed of an epoxy resin, a silicon resin, or a mixed resin thereof. Phosphor powder for converting a wavelength or light scattering powder for scattering light may be additionally added to the resin package part 16.

Referring to FIG. 2b, protrusion parts 17 protruding toward the LED chip 15 are disposed in regions adjacent to the LED chip 15 of facing inner sidewalls of the recessed portion R1, respectively.

Each of the protrusion parts 17 adopted in this embodiment has two reflective surfaces 17a and 17b. The reflective surfaces 17a and 17b of the protrusion part 17 are inclined toward both sidewalls disposed along the short-axis $L_b$ of the recessed portion R1.

The protrusion part 17 may have a triangular pyramid shape in which a lateral surface is integrated with a corresponding inner sidewall as illustrated in FIG. 2b.

A configuration of the recessed portion R1 adopted in the light emitting device 10 illustrated in FIG. 2b will be described in further detail through a perspective view of the FIG. 2c.

Figure 2C:
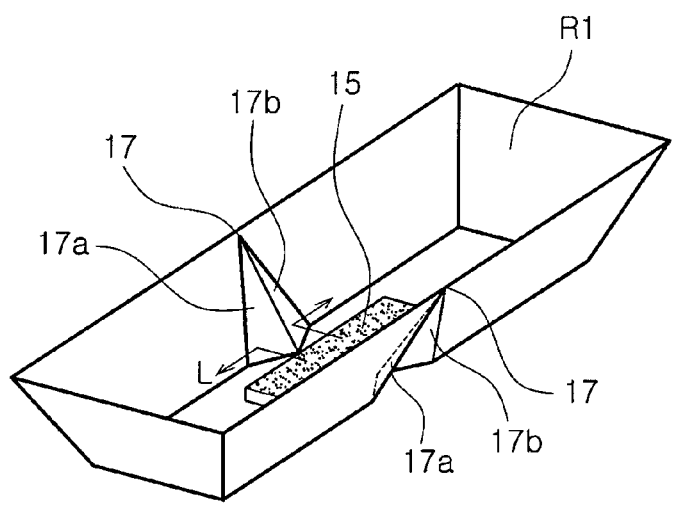
FIG. 2c is a transmitted perspective view illustrating a structure of a recessed portion adopted in FIG. 2.

Referring to FIG. 2c, a portion of light generated from the LED chip 15 is emitted toward inner sidewall regions adjacent to the LED chip 15, i.e., both end directions due to the reflective surfaces 17a and 17b of each of the protrusion parts 17 disposed in approximately central regions of the inner sidewalls disposed along the long-axis $L_a$ of the recessed portion R1.

Since the reflective surfaces 17a and 17b of the protrusion part 17 reflect the light toward both side ends of the long-axis $L_a$, the light condensed into a central region in which the LED chip 15 is disposed may be dispersed somewhat.

Since the protrusion part 17 adopted in the present invention reflects the light toward the both side directions, a light output distribution may be uniform at positions according to the long-axis direction $L_a$.

Also, the light output distribution may be uniform at the positions according to the long-axis direction $L_a$ due to a reduction of a light emitting space by the protrusion parts 17 as well as the reflective surfaces 17a and 17b in lateral direction of the protrusion parts 17. That is, a space within the recessed portion R1 may be the light emitting space. Thus, modified structures of the sidewalls such as the protrusion parts 17 are disposed on the sidewalls adjacent to the LED chip 15 to occupy the adjacent space within the recessed portion R1. Therefore, it may be understood that the light output provided from the space may be relatively reduced.

For this, in a structure of the recessed portion R1, a width of the short-axis direction adjacent to the LED chip 15 may be less than that of the short-axis direction at another position.

When the recessed portion R1 has a rectangular shape in plane-section, the protrusion parts 17 may occupy a space of approximately 10% to approximately 85% within a space of one third of the long-axis direction including the region in which the LED chip is disposed.

Thus, the protrusion parts 17 adopted in this embodiment occupy a portion of the light emitting space of regions adjacent to the LED chip 15 and disperse the portion of the light generated from the LED chip 15 onto the both side ends.

Figure 3A:
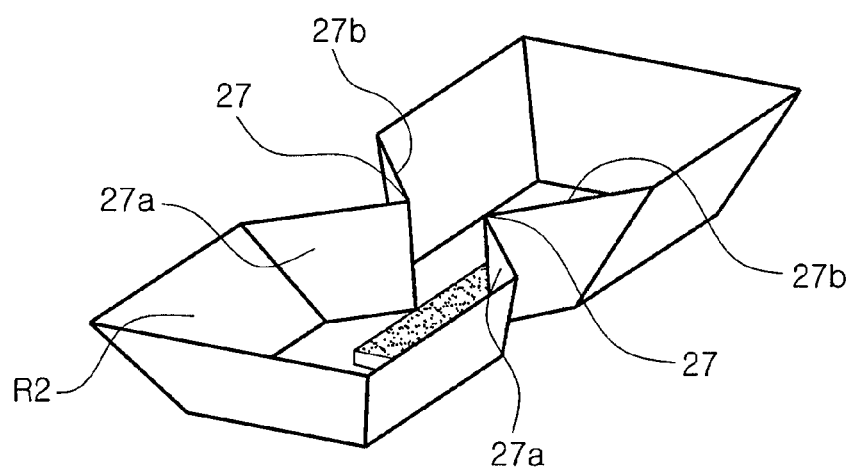
FIGS. 3a to 3c are transmitted perspective views illustrating a structure of a recessed portion adoptable in various embodiments of the present invention.
Figure 3B:
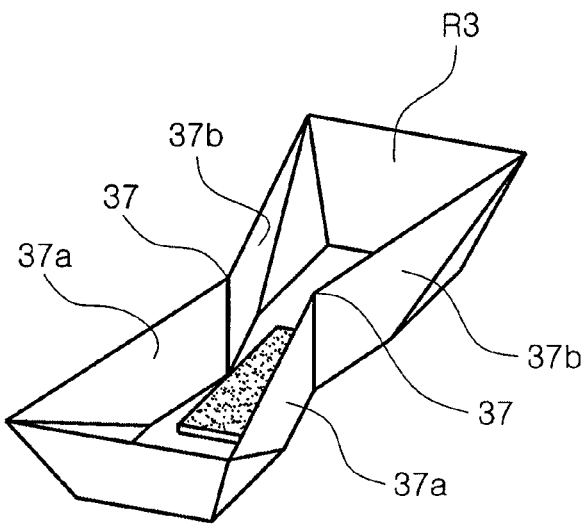
Figure 3C:
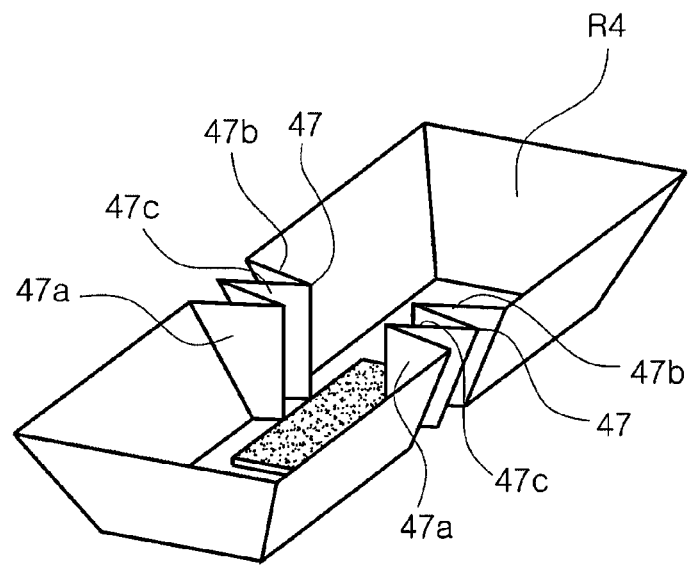

The protrusion parts 17 proposed in the present invention may be realized according to various embodiments. FIGS. 3a to 3c are transmitted perspective views illustrating a structure of a recessed portion adoptable in various embodiments of the present invention.

Referring to FIG. 3a, a recessed portion R2 has inner sidewalls inclined toward an upper side on the whole. A protrusion part 27 having two reflective surfaces 27a and 27b inclined toward both side ends and having a structure similar to that of the protrusion part 17 of FIG. 2c is disposed on each of the inner sidewalls disposed along a long-axis direction. However, unlike the aforementioned embodiment, the protrusion part 27 does not have the triangular pyramid shape, but have a triangular prism shape.

In this embodiment, the reflective surfaces 27a and 27b of the protrusion part 27 may be approximately perpendicular to a bottom surface or slightly inclined toward the bottom surface to maximally reduce light emitted into a direct upper side of an LED chip in regions adjacent to the LED chip.

Referring to FIG. 3b, a recessed portion R3 includes a protrusion part 37 disposed over an approximately entire area of each of inner sidewalls disposed along a long-axis direction. The protrusion part 37 reflects light toward both side directions through reflective surfaces 37a and 37b to realize a uniform light output at positions according to the long-axis direction. That is, in a structure of the protrusion part 37, a width of a short-axis direction of the recessed portion R3 may gradually increase in a direction away from a central region adjacent to an LED chip 35 over each of the entire inner sidewalls.

In addition, the protrusion part 37 may be realized in various shapes. As one modified example, the number of protrusion parts disposed on each of the inner sidewalls is not limited to one. For example, a plurality of protrusion parts may be provided. That is, referring to FIG. 3c, a recessed portion R4 may have two protrusion parts 47 on each of inner sidewalls.

In the recessed portion R4 of FIG. 3c, although a reflective surface 47c disposed between the protrusion parts 47 may be not largely contributed to a reflection effect toward lateral directions when compared to reflective surfaces 47a and 47b disposed on both sides of the protrusion parts 47, the reflective surface 47c may prevent a light emitting space from being significantly reduced to maintain a level of the total luminance at a required consistent level.

In order to confirm an improved effect of the present invention, two side-view type light emitting devices (embodiment 1 and embodiment 2) including a recessed portion according to an embodiment of the present invention and a side-view type light emitting device (comparative embodiment) having a structure of a related art recessed portion were manufactured to measure a light output distribution according to its positions.

The recessed portion according to the present invention was manufactured to have a structure similar to those of FIG. 2c and FIG. 3c. The side-view type light emitting device having the structure of the related art recessed portion was manufactured such that a protrusion part is not provided in the recessed portion. That is, recessed portions adopted in three light emitting devices have the same size when all of inner sidewalls have plane shapes, respectively, except the protrusion part. Thus, it may be understood that LED chips having the same specifications are mounted.

The light output distribution according to its positions along a long-axis direction was measured in each of the prepared side-view type light emitting devices. Light output distribution values according to its positions were measured at positions of approximately 100 μm upwardly away from a light emitting surface. As shown in FIG. 2a, when an LED chip is divided into one third along a side direction with respect to a central region of the LED chip, the light output distribution was measured at three points corresponding to a center of each of the divided regions ⓐ, ⓑ, and ⓒ. The measured results were illustrated in a graph of FIG. 4.

Figure 4:
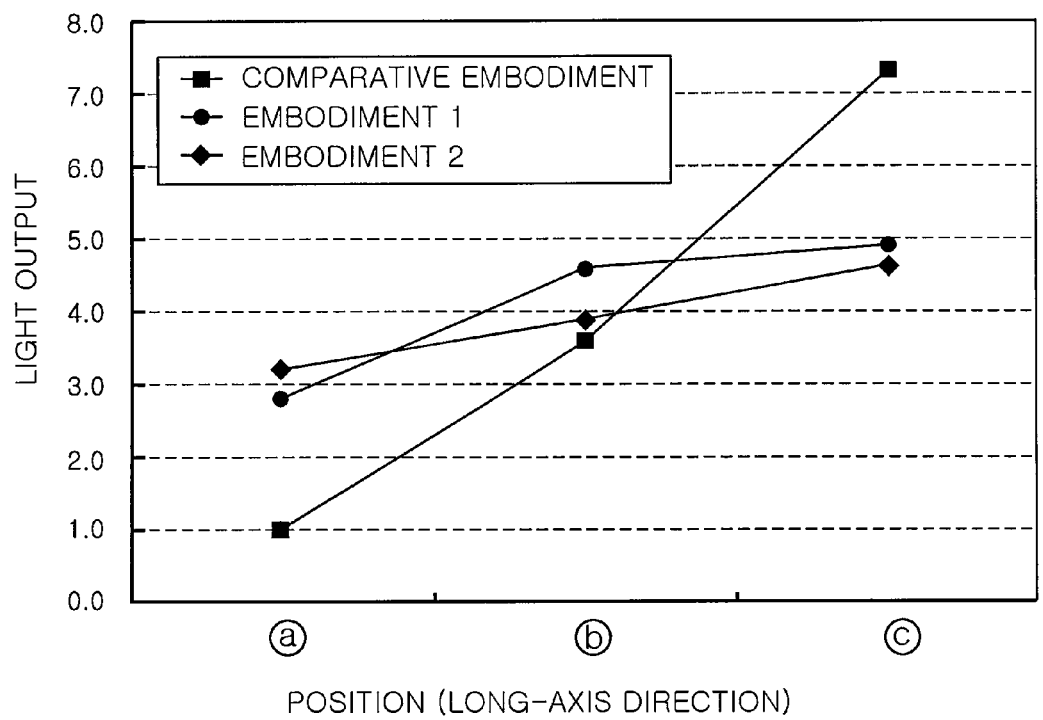
FIG. 4 is a graph illustrating light amount uniformity according to light emitting positions in order to confirm an improved effect of the present invention.

Referring to FIG. 4, the related art light emitting device (comparative embodiment) generates a light output difference more than approximately seven times because a declination therebetween significantly increases from a central portion toward both side ends. On the other hand, according to the light emitting device of the present invention, the light output in a central region is reduced on the whole by the protrusion part and the reflective surfaces. Also, since a light amount emitted toward the both side ends increases by the reflective surfaces, a light output may increase at the both side ends to realize a light output similar to that of an approximately line light source.

Specifically, according to the structure illustrated in FIG. 3a, the protrusion part occupies a relatively large region adjacent to the LED chip. In addition, the reflective surface increases in size and is approximately perpendicular to the bottom surface. Thus, the light emitted toward the upper side in the region adjacent to the LED chip may be reduced to realize a light output further similar to that of the line light source when compared to the embodiment 1.

Figure 5:
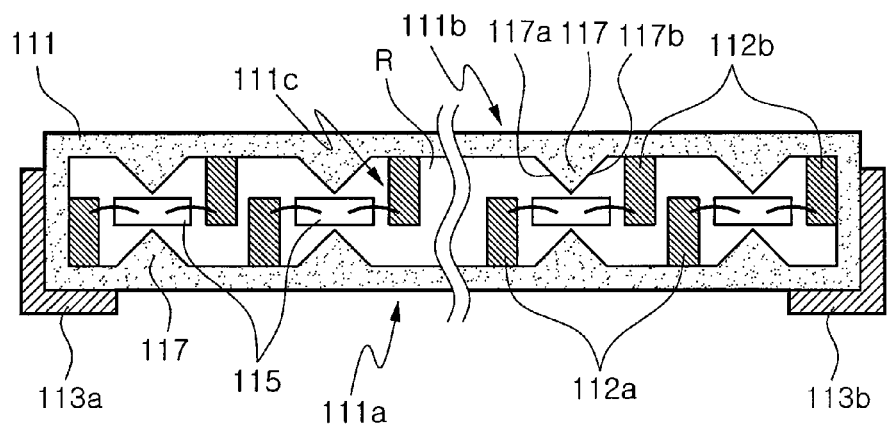
FIG. 5 is a plan view of a line light source type LED assembly according to the present invention.

Although a point light source may be adopted in the plurality of LED chips, a light emitting device that emits light approximately similar to that of the line light source can be provided using the above-described principles. FIG. 5 is a plan view of a line light source type LED assembly according to the present invention.

Referring to FIG. 5, a line light source type light emitting device according to an embodiment includes a package body 111 provided with a recessed portion R and a plurality of LED chips 115 mounted on a bottom surface of the recessed portion R.

The plurality of LED chips 115 is mounted on the bottom surface of the recessed portion R and electrically connected to first and second lead frames 112a and 112b, respectively.

In this embodiment, the LED chips 115 are mounted along a long-axis direction of the recessed portion R to achieve a light emitting effect similar to that of a line light source.

In this embodiment, the first lead frame 112a may be connected to a first external terminal 113a, and the second lead frame 112b may be connected to a second external terminal 113b such that the plurality of LED chips 115 may connected to each other in a row. However, the present invention is not limited thereto, and the plurality of LED chips may be connected to each other in a series or in a series-parallel combination by changing a lead frame structure and a bonding method.

As illustrated in FIG. 5, a protrusion part 117 protruding toward each of the LED chips 115 is disposed in a region adjacent to each of the LED chips 115 of facing inner sidewalls of the recessed portion R. The protrusion part 117 adopted in this embodiment may have reflective surfaces 117a and 117b inclined toward lateral directions as the aforementioned embodiment. Thus, since the plurality of LED chips 115 is successively arranged, a light emitting amount is reduced in regions adjacent to the LED chips 115, and the light emitting amount increases in regions away from the LED chips 115, i.e., between the LED chips 115, it may expect that the light emitting device according to the present invention almost acts as the line light source.

Although the protrusion part has an angled shape in which the reflective surfaces inclined toward the both ends are clearly divided in this embodiment, the present invention is not limited thereto. For example, as the light emitting surfaces of FIG. 5, the regions adjacent to the LED chips have narrow widths and the regions between the LED chips have wide widths, respectively. Thus, the inner sidewalls may have a wave shape on the whole.

As illustrated in FIG. 5, the line light source according to this embodiment may be realized as the line light source of an LED assembly for the side-view type light emitting device. In this case, the package body 111 has a first surface 111a provided as a mount surface, a second surface 111b disposed on a side opposite to the first surface, and lateral surfaces disposed between the first surface 111a and the second surface 111b. The recessed portion R is disposed on a lateral surface corresponding to a light emitting surface 111c of the lateral surfaces.

According to the present invention, in order to realize the uniform light irradiation, the light output irradiated from the LED light source into the light receiving device such as the light guiding panel can be relatively uniformly maintained according to their light emitting positions. The line light source type light emitting device including the plurality of LED chips can be provided using a method for adjusting the light amount according to its positions.

While the present invention has been shown and described in connection with the exemplary embodiments, it will be apparent to those skilled in the art that modifications and variations can be made without departing from the spirit and scope of the invention as defined by the appended claims.

What is claimed is:

1. A side-view type light emitting device comprising:
    a package body having a first surface provided as a mounting surface, a second surface disposed on a side opposite to the first surface, and lateral surfaces disposed between the first surface and the second surface, the package body comprising a recessed portion formed in a lateral surface corresponding to a light emitting surface of the lateral surfaces;
    a lead frame disposed in the package body; and
    a light emitting diode (LED) chip mounted on a bottom of the recessed portion,
    wherein a plurality of protrusion parts are formed on each of two facing sidewalls protruding toward the LED chip such that the LED chip is disposed therebetween, the two facing sidewalls are disposed along a long-axis direction of the recessed portion,
    each of the protrusion parts has two reflective surfaces, and the two reflective surfaces are inclined toward both sidewalls disposed along a short-axis direction of the recessed portion, respectively, and
    at least one reflective surface is disposed between the plurality of protrusion parts formed on one of the sidewalls.

2. The side-view type light emitting device of claim 1, wherein each of the protrusion parts has a triangular pyramid shape in which a lateral surface is integrated with each of the inner sidewalls.

3. The side-view type light emitting device of claim 1, wherein each of the protrusion parts extends up to the both sidewalls disposed along the short-axis direction of the recessed portion.

4. The side-view type light emitting device of claim 3, wherein a width of the short-axis direction of the recessed portion in which the protrusion parts are disposed gradually increases in a direction away from a central region adjacent to the LED chip.

5. The side-view type light emitting device of claim 1, wherein the protrusion parts are provided in plurality, and each of the protrusion parts disposed on the inner sidewalls is disposed in a depth direction of the recessed portion.

6. The side-view type light emitting device of claim 1, further comprising a resin package part disposed inside the recessed portion to surround the LED chip.

7. The side-view type light emitting device of claim 6, wherein the resin package part contains phosphor powder for converting a wavelength of light generated from the LED chip.

8. A side-view type light emitting device comprising:
    a package body having a first surface provided as a mounting surface for an LED chip, a second surface disposed on a side opposite to the first surface, and lateral surfaces disposed between the first surface and the second surface, the package body comprising a recessed portion formed in a lateral surface corresponding to a light emitting surface of the lateral surfaces,
    wherein inner sidewalls are disposed along a long-axis direction of the recessed portion and each inner sidewall includes a plurality of protruding parts which protrude toward the LED chip,
    the plurality of protruding parts have two reflective surfaces having a triangular prism shape, the two reflective surfaces are inclined toward both sidewalls disposed along a short-axis direction of the recessed portion, respectively, and
    at least one reflective surface is disposed between the plurality of protruding parts formed on one of the inner sidewalls.

9. The side-view type light emitting device of claim 8, wherein inner sidewalls of the recessed portion have regions in which the width of the short-axis direction adjacent to the LED chip gradually increases toward both ends of a long-axis direction, respectively.

10. The side-view type light emitting device of claim 8, wherein inner sidewalls of the recessed portion are disposed such that the width of the short-axis direction adjacent to the LED chip gradually increases up to both ends of a long-axis direction.

11. A line light source type light emitting device comprising:
   a package body comprising a recessed portion;
   a lead frame disposed in the package body; and
   a plurality of LED chips mounted on a bottom of the recessed portion along a long-axis direction of the recessed portion,
   wherein a plurality of protrusion parts are formed on each of two facing sidewalls protruding toward the LED chips such that the LED chips are disposed therebetween, and the two facing sidewalls are disposed along a long-axis direction of the recessed portion,
   each of the protrusion parts has two reflective surfaces, the two reflective surfaces are inclined toward both sidewalls disposed along a short-axis direction of the recessed portion, respectively, and
   at least one reflective surface is disposed between the plurality of protrusion parts formed on one of the sidewalls.

12. The line light source type light emitting device of claim 11, wherein the package body has a first surface provided as a mount surface, a second surface disposed on a side opposite to the first surface, and lateral surfaces disposed between the first surface and the second surface, and the recessed portion is formed in a lateral surface corresponding to a light emitting surface of the lateral surfaces.

13. The line light source type light emitting device of claim 12, further comprising a resin package part disposed inside the recessed portion to surround the LED chips.

14. The line light source type light emitting device of claim 13, wherein the resin package part contains phosphor powder for converting wavelengths of light generated from the LED chips.

15. The side-view type light emitting device of claim 1, wherein at least one of the two reflective surfaces is inclined relative to the bottom of the recessed portion or includes sides extending in a depth direction of the recessed portion along intersecting axes.

16. The side-view type light emitting device of claim 8, wherein at least one of the two reflective surfaces is inclined relative to the bottom of the recessed portion or includes sides extending in a depth direction of the recessed portion along intersecting axes.

17. The line light source type light emitting device of claim 11, wherein at least one of the two reflective surfaces is inclined relative to the bottom of the recessed portion or includes sides extending in a depth direction of the recessed portion along intersecting axes.

* * * * *